US00RE39782E

(19) United States
(12) Reissued Patent
Winker

(10) Patent Number: US RE39,782 E
(45) **Date of Reissued Patent: *Aug. 21, 2007**

(54) MONOLITHIC OPTICAL COMPENSATION DEVICE FOR IMPROVED VIEWING ANGLE IN LIQUID CRYSTAL DISPLAYS

(75) Inventor: Bruce Winker, Ventura, CA (US)

(73) Assignee: Teledyne Licensing, LLC, Thousand Oaks, CA (US)

( * ) Notice: This patent is subject to a terminal disclaimer.

(21) Appl. No.: 09/447,900

(22) Filed: Nov. 15, 1999

Related U.S. Patent Documents

Reissue of:
(64) Patent No.: 5,612,801
Issued: Mar. 18, 1997
Appl. No.: 08/313,532
Filed: Sep. 30, 1994

U.S. Applications:
(63) Continuation-in-part of application No. 08/223,251, filed on Apr. 4, 1994, now Pat. No. 5,504,603.

(51) Int. Cl.
*G02F 1/335* (2006.01)

(52) U.S. Cl. ..... 349/119; 349/120
(58) Field of Classification Search ..... 349/117, 349/118, 119
See application file for complete search history.

(56) References Cited

U.S. PATENT DOCUMENTS

| | | | | |
|---|---|---|---|---|
| 4,516,837 A | | 5/1985 | Soref et al. | 350/347 |
| 4,533,214 A | | 8/1985 | Penz et al. | 359/63 |
| 4,701,028 A | | 10/1987 | Clerc et al. | 350/337 |
| 5,184,237 A | | 2/1993 | Iimura et al. | 359/63 |
| 5,196,953 A | | 3/1993 | Yeh et al. | 359/73 |
| 5,311,340 A | | 5/1994 | Murata et al. | 359/73 |
| 5,337,174 A | | 8/1994 | Wada et al. | 359/63 |
| 5,344,916 A | | 9/1994 | Harris et al. | 359/73 |
| 5,375,006 A | | 12/1994 | Haas | 359/73 |
| 5,504,603 A | * | 4/1996 | Winker et al. | 349/117 |
| 5,506,706 A | * | 4/1996 | Yamahara et al. | 349/117 |
| 6,169,590 B1 | * | 1/2001 | Abileah et al. | 349/120 |
| 6,320,634 B1 | * | 11/2001 | Winker et al. | 349/117 |

FOREIGN PATENT DOCUMENTS

| | | |
|---|---|---|
| EP | 0367288 | 5/1990 |
| EP | 0576342 | 12/1993 |
| JP | 5-157913 | 6/1993 |
| JP | 6-174920 | 6/1994 |

OTHER PUBLICATIONS

Kahn, The molecular physics of liquid crystal devices, Physics Today, pp. 66–74, May 1982.
Macleod, Structure–related optical properties of thin films, J. Vac. Sci. Technol. A, vol. 4, No. 3, pp. 418–422 (1986).
Motohiro, et al., Thin film retardation plate by oblique deposition, Appl. Opt., vol. 28, No. 3, pp. 2466–2482 (1989).
Emsworth, Archromatic retardation layers based on anisotropic polymer networks, Research Disclosure, No. 337, p. 411 (1992).

* cited by examiner

*Primary Examiner*—James A. Dudek
(74) *Attorney, Agent, or Firm*—John J. Deinken; David J. Zoetewey

(57) ABSTRACT

A monolithic O-plate optical compensator device, in accordance with the invention, comprises a plurality of thin-film compensation layers which are deposited on a single substrate. As used herein, the term "monolithic" is meant to imply that the O-plate and other thin-film compensator layers are formed by depositing (e.g., via solvent casting or vacuum deposition) one layer on top of another layer; with or without the use of surface modification treatments such as adhesion layers, alignment layers, and the like.

7 Claims, 12 Drawing Sheets

MONOLITHIC OPTICAL COMPENSATION DEVICE FOR IMPROVED VIEWING ANGLE IN LIQUID CRYSTAL DISPLAYS

Matter enclosed in heavy brackets [ ] appears in the original patent but forms no part of this reissue specification; matter printed in italics indicates the additions made by reissue.

This is a continuation-in-part application of U.S. patent application Ser. No. 223,251, filed Apr. 4, 1994, entitled "Optical Compensator for Improved Gray Scale Performance in Liquid Crystal Display," now U.S. Pat. No. 5,504,603. In addition, U.S. Pat. No. 5,196,953 and the following contemporaneously filed U.S. patent applications are hereby incorporated by reference: (i) "Inorganic Thin Film Compensator For Improved Gray Scale Performance in Twisted Nematic Liquid Crystal Displays" by William J. Gunning, III, Bruce K. Winker, Donald B. Taber, Paul H. Kobrin, James C. Beedy, and John P. Eblen, Jr.; and (ii) "Organic Polymer O-Plate Compensator For Improved Gray Scale Performance in Twisted Nematic Liquid Crystal Displays" by Bruce K. Winker, Hong-Son Ryang, Leslie F. Warren, Jr., and Charles Rosenblatt, Zili Li, and Young J. Chung. All referenced patents and patent applications are commonly assigned with this application.

TABLE OF CONTENTS

1. REFERENCES
2. BACKGROUND OF THE INVENTION
2.1 LCD Technology Overview
2.2 Normally White Twisted Nematic LCDs
2.3 Normally White Twisted Nematic LCD Characteristics
2.3(a) C-Plate Compensation
2.3(b) Gray Scale Stability
2.3(c) O-Plate Gray Scale Compensation
2.3(d) O-Plate Technology
2.4 Summary
3. SUMMARY OF THE INVENTION
4. BRIEF DESCRIPTION OF DRAWINGS
5. DETAILED DESCRIPTION OF A SPECIFIC EMBODIMENT
5.1 Overview of Liquid Crystal Display Structure
5.2 Monolithic Compensator Structure
5.3 Manufacture of the Monolithic Compensator
5.4 Advantages of the Monolithic Compensator
6. BIBLIOGRAPHY
7. CLAIMS
8. ABSTRACT

2. BACKGROUND OF THE INVENTION

This invention is concerned with the design of liquid crystal displays (LCDs) and, more particularly, with techniques for maximizing the field of view of such displays by maintaining a high contrast ratio and minimal variance in relative gray levels over a wide range of viewing angles. These goals are achieved through the fabrication and manufacture of LCDs using a monolithic compensator device.

2.1 LCD Technology Overview

Liquid crystals are useful for electronic displays because polarized light traveling through a liquid crystal layer is affected by the layer's birefringence, which can be changed by the application of a voltage across the layer. By using this effect, the transmission or reflection of light from an external source, including ambient light, can be controlled with much less power than is required for the luminescent materials used in other types of displays. As a result, liquid crystal displays are now commonly used in a wide variety of applications, such as, for example, digital watches, calculators, portable computers, and many other types of electronic equipment. These applications highlight some of the advantages of LCD technology including very long operational life in combination with very low weight and low power consumption.

The information content in many liquid crystal displays is presented in the form of multiple rows of numerals or characters, which are generated by segmented electrodes deposited in a pattern on the display. The electrode segments are connected by individual leads to electronic driving circuitry. By applying a voltage to the appropriate combination of segments, the electronic driving circuitry controls the light transmitted through the segments.

Graphic and television displays may be achieved by employing a matrix of pixels in the display which are connected by an X-Y sequential addressing scheme between two sets of perpendicular conductors. More advanced addressing schemes, applied predominantly to twisted nematic liquid crystal displays, use arrays of thin film transistors to control driving voltages at the individual pixels.

Contrast and stability of relative gray scale intensities are important attributes in determining the quality of a liquid crystal display. The primary factor limiting the contrast achievable in a liquid crystal display is the amount of light which leaks through the display in the dark state. In addition, the contrast ratio of the liquid crystal device also depends on the viewing angle. The contrast ratio in a typical liquid crystal display is a maximum only within a narrow viewing angle centered about normal incidence and drops off as the angle of view is increased. This loss of contrast ratio is caused by light leaking through the black state pixel elements at large viewing angles. In color liquid crystal displays, such leakage also causes severe color shifts for both saturated and gray scale colors.

The viewing zone of acceptable gray scale stability in a typical prior art twisted nematic liquid crystal display is severely limited because, in addition to color shifts caused by dark state leakage, the optical anisotropy of the liquid crystal molecules results in large variations in gray level transmission, i.e., a shift in the brightness-voltage curve, as a function of viewing angle. The variation is often severe enough that, at extreme vertical angles, some of the gray levels reverse their transmission levels. These limitations are particularly important for applications requiring a very high quality display, such as in avionics, where viewing of cockpit displays from both pilot and copilot seating positions is important. Such high information content displays require that the relative gray level transmission be as invariant as possible with respect to viewing angle. It would be a significant improvement in the art to provide a liquid crystal display capable of presenting a high quality, high contrast image over a wide field of view.

FIGS. 1A and 1B show a conventional normally, white, twisted nematic liquid crystal display 100 including a polarizer 105, an analyzer 110 with a polarization axis perpendicular to that of the polarizer 105, a light source 130, and a viewer 135.

In the normally white configuration of FIGS. 1A and 1B, a "nonselect" area 115 (no applied voltage) appears light, while a "select" area 120 (those which are energized by an applied voltage) appear dark. In the select area 120 the liquid crystal molecules tend to tilt and rotate toward alignment with the applied electric field. If this alignment were perfectly homeotropic, all the liquid crystal molecules in the cell would be oriented with their long axes normal to the cell's major surface.

Because the liquid crystals used for twisted nematic displays exhibit positive birefringence, this arrangement, known as the homeotropic configuration, would exhibit the optical symmetry of a positively birefringent C-plate. As is well known in the art, a C-plate is a uniaxial birefringent plate with its extraordinary axis (i.e., its optic or c-axis) perpendicular to the surface of the plate (parallel to the direction of normally incident light). In the select state the liquid crystal in a normally white display would thus appear isotropic to normally incident light, which would be blocked by the crossed polarizers.

One reason for the loss of contrast with increased viewing angle which occurs in a normally white display is that a homeotropic liquid crystal layer will not appear isotropic to off-normal light. Light propagating through the layer at off-normal angles appears in two modes due to the birefringence of the layer; a phase delay is introduced between those modes and increases with the incident angle of the light. This phase dependence on incidence angle introduces an ellipticity to the polarization state which is incompletely extinguished by the second polarizer, giving rise to light leakage. To correct for this effect, an optical compensating element must also have C-plate symmetry, but with negative birefringence ($n_e<n_o$). Such a compensator will introduce a phase delay opposite in sign to the phase delay caused by the liquid crystal layer, thereby restoring the original polarization state and allowing light passing through energized areas of the layer to be blocked more completely by the output polarizer. C-plate compensation, however, does not impact the variation of gray scale with viewing angle, which is addressed by the present invention.

FIG. 2 depicts the coordinate system which is used to describe the orientation of both liquid crystal and birefringent compensator optic axes. Light propagates toward the viewer 200 in the positive z direction 205 which, together with the x-axis 210 and the y-axis 215, form a right-handed coordinate system. Backlighting is provided, as indicated by the arrows 220, from the negative z direction. The polar tilt angle Θ 225 is defined as the angle between the liquid crystal's molecular optic axis ĉ 230 and the x-y plane, measured from the x-y plane. The azimuthal or twist angle Φ 235 is measured from the x-axis to the projection 240 of the optic axis into the x-y plane.

2.2 Normally White Twisted Nematic LCDs

FIG. 3 is a cross sectional schematic view of a prior art twisted nematic, transmissive type normally white liquid crystal display. The display includes a polarizer layer 300 and an analyzer layer 305, between which is positioned a liquid crystal layer 310, consisting of a liquid crystal material in the nematic phase.

It is convenient in describing the orientation of various compensation elements of the display to refer to a normal axis perpendicular to the display, which is depicted by a dashed line 370. The polarizer 300 (with a polarization direction in the plane of the drawing 315) and the analyzer 305 (with a polarization direction into the plane of the drawing 320) are oriented with their polarization directions at 90° to one another, as is the case for a normally white display. (A polarizer 300 and an analyzer 305 both polarize electromagnetic fields. Typically, however, the term 'polarizer' refers to a polarizer element that is closest the source of light while the term 'analyzer' refers to a polarizer element that is closest the viewer of the LCD.) A first transparent electrode 325 and a second transparent electrode 330 are positioned adjacent to opposite surfaces of the liquid crystal layer 310 so that a voltage can be applied, by means of a voltage source 335, across the liquid crystal layer. The liquid crystal layer is in addition sandwiched between a pair of glass plates 340 and 345. As is explained below, the inner surfaces of the glass plates 340 and 345, which are proximate to the liquid crystal layer 310, can be physically or chemically treated to affect the desired liquid crystal orientation, as by buffing.

As is well known in the LCD art (see, e.g., Kahn, "The Molecular Physics of Liquid-Crystal Devices," Physics Today, pp. 68-74, May 1982), when the material of the liquid crystal layer 310 is in the nematic phase and the inner surfaces of the plates 340 and 345 (the surfaces adjacent to the layer 310) are coated with a surface treatment for aligning the liquid crystal such as polyimide, buffed, and oriented with their buffed directions perpendicular, the director of the liquid crystal material, absent any applied electrical voltage, will tend to align with the buffed direction (known as the "rub direction") in the regions of the layer proximate each of the plates 340 and 345. Furthermore, the director will twist smoothly with respect to the normal axis through an angle of 90° along a path in the layer 310 from the first major surface adjacent to the plate 340 (i.e., at the 310/340 interface) to the second major surface adjacent to the plate 345 (i.e., at the 310/345 interface).

In the absence of an applied electric field the direction of polarization of incoming polarized light will be rotated by 90° in traveling through the liquid crystal layer. When the glass plates and the liquid crystal layer are placed between crossed polarizers, such as the polarizer 300 and the analyzer 305, light polarized by the polarizer and traversing the display, as exemplified by the light ray 350, will thus be aligned with the polarization direction of the analyzer 320 and therefore will pass through the analyzer.

When a sufficient voltage is applied to the electrodes 325 and 330, however, the applied electric field causes the director of the liquid crystal material to tend to align parallel to the field. With the liquid crystal material in this state, light passed by the polarizer 300, as illustrated by the light ray 355, will be extinguished by the analyzer 305. Thus, an energized pair of electrodes will produce a dark region in the display, while light passing through regions of the display which are not subject to an applied field will produce illuminated regions. As is well known in the LCD display art, an appropriate pattern of electrodes, activated in selected combinations, can be utilized in this manner to display alphanumeric or graphic information. As explained further below, one or more compensator layers, such as the layers 360 and 365, may be included in the display to improve the quality of the display.

2.3 Normally White Twisted Nematic LCD Characteristics

FIG. 4 shows a calculated plot of liquid crystal director tilt as a function of position in a liquid crystal layer (where the cell gap has been normalized to unity) in a 90° twisted nematic cell. Typical distributions for molecular tilt angles when no voltage is applied (curve 400), under a typical select state voltage (curve 405), and under the application of several intermediate voltages chosen to yield linearly spaced gray levels (curves 410, 415, 420, 425, 430, and 435) are shown.

FIG. 5 is a related plot for the same cell depicting the calculated twist angle of the liquid crystal molecules as a function of position in the cell. When there is no applied voltage, the twist is distributed evenly throughout the cell (straight line curve 500). Under a fully select state voltage, the twist angles are distributed as shown by the external, S-shaped curve 505. The twist distributions for gray levels are shown by the intermediate curves between the two curves 500 and 505.

As illustrated by FIGS. 4 and 5, when the fully selected voltage is applied nearly all of the twist experienced by the liquid crystal molecules, and a substantial portion of the tilt, occurs in the central region of the cell. Because of this phenomena, the continuous variation of molecular orientation within the cell can be separated into three regions, each of which is characterized by its own optical symmetry. Thus, the central regions 440 (FIG. 4) and 510 (FIG. 5) can be considered as nominally homeotropic in the fully selected state, approximating the properties of a C-plate. The regions 445 and 450 (FIG. 4) and 515 and 520 (FIG. 5), near each surface of the cell, behave as A-plates, each with its extraordinary axis aligned with the rub direction of the proximate substrate. Because there is essentially no twist in the molecules in the regions 445, 450, 515, and 520, the molecules are essentially aligned with the respective rub directions on either side of the liquid crystal layer. In addition, because the twist angle of the molecules in the regions 445 and 515 tends to be perpendicular to the twist angle of the molecules in the regions 450 and 520, the effect of these two regions on light traveling through the cell tends to be canceled, leaving the middle C-plate region to exert the dominant influence.

2.3(a) C-Plate Compensation

As is well known in the art, a negative C-plate compensator is designed to correct for the angle dependent phase shift introduced by propagation through the central, approximately C-plate region of a LCD cell. Such a compensator is effective to the extent that the optical symmetry of the central region dominates the selected state of the liquid crystal cell, that is, the extent to which the molecules align with the applied field. This implies that negative C-plate compensation will work best when strong fields are used for the energized state as this makes the homeotropic approximation more nearly correct. The use of a C-plate has been demonstrated to significantly reduce the leakage of the dark state over an extended field of view, thus improving contrast and reducing color desaturation.

2.3(b) Gray Scale Stability

While the use of a C-plate compensator may be used to eliminate color desaturation, it does not improve gray scale stability. The problem of maintaining constant gray scale luminance differences over the field of view relates substantially to the brightness level changes for levels assigned between the select (black for a normally white display) and nonselect (white for a normally white display) states. This phenomenon is generally depicted using transmission, or brightness, versus voltage (BV) electro-optic response curves for a display to which eight gray levels are assigned, from level 0 (the select black state) to level 7 (the nonselect white state). Gray levels between 0 and 7 are chosen by assigning them a set of voltages spaced linearly in brightness along the BV curve between the select and nonselect voltages.

FIG. 6 is a plot of calculated BV (transmission versus drive voltage) curves for a normally white, 90° twisted nematic display as the horizontal viewing angle varies from 0° to 40° in 10° increments while the vertical viewing angle remains fixed at 0°. (The change in the BV curves with horizontal angle is, to first order, independent of whether the horizontal deviation is to the left or right.) Note that the regions of each curve over which gray levels would be selected almost overlie one another for the various horizontal angles. This means that gray levels chosen to be linearly spaced at zero degrees would remain very nearly linear at even high horizontal viewing angles.

The gray scale stability problem appears most predominantly when the vertical viewing angle varies. This is illustrated in FIG. 7, which shows a series of BV curves for a normally white, 90° twisted nematic display as the vertical viewing angle varies from −10° to +30° while the horizontal viewing angle remains fixed at 0°. It can be observed that for angles below 0° (measured from the normal) the BV curves shift to the right (higher voltage), and fall monotonically from their maximum but fail to reach zero.

For angles above normal, the curves shift to the left and develop a rebound after an initial minimum. These effects can be explained by considering the perspective of viewers looking at the display from above, at, and below normal, as shown in FIG. 8. The critical feature to note is the relationship between the light traveling towards the viewer and the average liquid crystal director tilt at the center of a cell as voltage across the cell is increased.

For instance, as the voltage across a cell is increased, the average liquid crystal director in the center of the cell tilts from a parallel (with respect to the polarizer 300 and analyzer 305) orientation 815 toward a homeotropic one 825. For the viewer at normal incidence 800, retardation is highest at the nonselect state voltage and lowest at the select state voltage. When the anisotropy is zero, the polarization state of the light is unchanged and it is blocked by the analyzer. Thus, the viewer sees a monotonic decrease in brightness to zero with increasing voltage.

Now consider the case of a positive vertical viewing direction (viewer above normal incidence 805). At some intermediate voltage the average director 820 points toward the viewer and the retardation is minimal. Here the viewer sees a brightness with voltage that initially decreases toward a minimum, at the point of minimal retardation, and then increases.

For the negative vertical viewing direction (viewer below normal incidence 810), the average director always presents a large anisotropy to a light ray, even at the highest voltage. The viewer therefore sees a monotonic decrease in brightness. Furthermore, the average liquid crystal director is always oriented at a larger angle with respect to the light ray for the below normal viewer 810 than it is for the normal incidence viewer 800. Therefore the anisotropy is greater and the brightness level is always higher in the negative vertical viewing direction than it is at normal incidence.

This dependency of an LCD's brightness versus viewing angle, has a profound impact on gray scale stability. In particular, the variation in gray level luminance versus vertical viewing angle can be extreme. (Note that a voltage chosen to yield a 50% gray level on the 0° curve in FIG. 7 yields a dark state on the +30° curve and approaches a fully white state at −10°).

2.3(c) O-Plate Gray Scale Compensation

To eliminate reversal of gray levels and improve gray scale stability, a birefringent O-plate compensator can be used. The O-plate compensator principle, as described in U.S. patent application Ser. No. 223,251 utilizes a positive birefringent material with its principal optic axis oriented at a substantially oblique angle with respect to the plane of the display (hence the term "O-plate"). "Substantially oblique" implies an angle appreciably greater than 0° and less than 90°. O-plates have been utilized, for example, with angles relative to the plane of the display between 30° and 60%, typically at 45°. Moreover, O-plates with either uniaxial or biaxial materials can be used. O-plate compensators can be placed in a variety of locations between a LCD's polarizer layer and analyzer layer.

In general, O-plate compensators may also include A-plates and/or negative C-plates as well as O-plates. As is well known in the art, an A-plate is a birefringent layer with its extraordinary axis (i.e., its c-axis) oriented parallel to the surface of the layer. Its a-axis is thus oriented normal to the surface (parallel to the direction of normally incident light), leading to its designation as an A-plate. A-plates may be fabricated by the use of uniaxially stretched polymer films, such as polyvinyl alcohol, or other suitably oriented organic birefringent materials.

A C-plate is a uniaxial birefringent layer with its extraordinary axis oriented perpendicular to the surface of the layer (parallel to the direction of normally incident light). Negatively birefringent C-plates may be fabricated by the use of uniaxially compressed polymers (See, e.g., Clerc, U.S. Pat. No. 4,701,028), stretched polymer films, or by the use of physical vapor deposited inorganic thin films (See, e.g., Yeh, U.S. Pat. No. 5,196,953), for example.

Oblique deposition of a thin film by physical vapor deposition is known to produce a film having birefringent properties (see, e.g., Motohiro and Taga, "Thin Film Retardation Plate by Oblique Deposition," Appl. Opt., Vol. 28, No. 3, pp. 2466-2482, 1989). By further exploiting on the tilted orientation of the symmetry axis, the Motohiro process can be refined or enhanced to fabricate O-plates. Such components are by their nature biaxial. Their growth characteristics generate a microscopic columnar structure. The angles of the columns are tipped toward the direction of the arrival of a vapor stream. A deposition angle (measured from normal) of 76°, for example, results in a column angle of approximately 45°. The columns develop an elliptical cross section as the result of shadowing. This elliptical ross section gives rise to the biaxial character of the films. The birefringence, in magnitude and symmetry, is entirely attributable to the film microstructure and is referred to as form birefringence. These phenomena in thin films have been extensively studied and described by Macleod ("Structure-Related Optical Properties of Thin Films," J. Vac. Sci. Technol. A, Vol. 4, No. 3, pp. 418-422, 1986).

Uniaxial O-plate components similarly offer numerous solutions. These may be fabricated by the use of suitably oriented organic birefringent materials. Those skilled in the art will recognize other means for fabricating both uniaxial and biaxial O-plates.

FIGS. 9 and 10 show one effect that an O-plate compensator layer can have on a normally white twisted nematic display. FIG. 9 shows the O-plate compensator layer's effect on the electro-optic response of the display at various horizontal viewing angles while FIG. 10 shows the O-plate compensator layer's effect on the display's vertical viewing angle. In this particular embodiment, one A-plate layer is positioned adjacent to the liquid crystal layer on both sides of the liquid crystal cell. An O-plate layer is disposed between the polarizer layer and the A-plate/liquid crystal/A-plate stack. The variation in the BV curves versus both horizontal and vertical viewing angles are greatly reduced relative to the uncompensated case shown in FIGS. 6 and 7.

Elimination of gray scale reversal by the use of an O-plate compensator layer occurs in the following manner. In the positive vertical viewing direction, the retardation of the O-plate increases with viewing angle and tends to offset the decreasing retardation of the liquid crystal layer. When the viewer is looking down the axis of the average liquid crystal director, the presence of the O-plate prevents the layers between the two polarizers from appearing isotropic. Thus the rebound in the BV curve, shown in FIG. 7, is reduced and moved to higher voltages outside of the gray scale voltage range as shown in FIG. 10.

In the negative vertical viewing direction, the combination of an O-plate and an A-plate with their optic axes nominally at right angles tends to exhibit birefringence characteristics similar to that of a negative birefringence retarder with its optic axis oriented perpendicular to the plane containing the axes of the O-plate and A-plate. The direction of this retarder axis is nominally parallel to the orientation of the average liquid crystal in the central region of the cell when it is driven at a voltage between select and nonselect states. Thus, the presence of an O-plate oriented in this manner tends to cancel the birefringence of the liquid crystal layer, pulling the BV curve down, or equivalently, moving it toward the direction of lower voltages (i.e., left). A similar effect occurs in the positive and negative horizontal viewing directions as well.

The overall effect of introducing an O-plate compensator in this manner is to eliminate large rebounds in the gray scale voltage region and reduce the left-to-right shift in the BV curves as the viewing angle is varied from negative to positive vertical angles.

The orientations of the compensator optic axes can be carefully chosen so that the combined retardation effects cancel each other in the normal incidence viewing direction as well as minimize rebounds in the horizontal viewing direction. Combinations of more than one O-plate can be used as long as their orientations satisfy these requirements. Furthermore, negative C-plates can, for certain configurations, increase the contrast ratio at large fields of view, occasionally with some decrease in gray scale stability.

2.3(d) O-Plate Technology

The liquid crystal layer, the compensator layer(s), the polarizer layer, and the analyzer layer may assume a variety of orientations relative to one another in a liquid crystal display. Some of the possible configurations which have been considered, and set out in U.S. patent application Ser. No. 223,251 are repeated in Table 1; where 'A' represents an A-plate, 'C' represents a C-plate, 'O' represents an O-plate, 'LC' represents the liquid crystal, and 'OxO' represents crossed O-plates. Crossed O-plates are adjacent O-plates with their azimuthal angles Φ 235 nominally crossed, one oriented between 0° and 90°; and the second oriented between 90° and 180°.

TABLE 1

| Liquid Crystal Display Elements | | | | | |
|---|---|---|---|---|---|
| ←Toward Rear (Polarizer Side) | | | Toward From (Analyzer Side)→ | | |
| | O | A | LC | | |
| | A | O | LC | | |
| | | O | LC | O | A |
| A | O | A | LC | | |
| | O | A | LC | A | |
| O | A | C | LC | | |
| | O × O | A | LC | | |
| A | O × O | A | LC | | |
| | | A | LC | O × O | A |

TABLE 1-continued

| Liquid Crystal Display Elements | | | | | | | |
|---|---|---|---|---|---|---|---|
| ←Toward Rear (Polarizer Side) Toward From (Analyzer Side)→ | | | | | | | |
| A | O | A | C | LC | | | |
| | | A | O | LC | O | A | |
| | A | O | C | LC | C | O | |
| | A | O | C | LC | C | O | A |
| | C | A | O | LC | O | A | C |

The projections of the principal axes onto the plane of the display with respect to the liquid crystal director can vary with the embodiment. In some cases, for example with two O-plates, the O-plate axis projections are at 45° with respect to the average liquid crystal director, while in others, the O-plate axis projection is parallel with that of the liquid crystal director.

Crossed O-plate (OxO) designs that are further compensated with A-plates provide additional design flexibility. The choice of A-plate value is not critical as such designs can be adjusted by varying the relative orientations of the A-plates. Thus, it is possible to generate desired solutions with commercially available A-plate retardation values.

The flexibility which an O-plate compensation scheme offers the display designer allows tailoring of performance to specific display product requirements. It is possible, for example, with simple configuration and parameter modifications to achieve isocontrast optimized for left or right viewing, isocontrast optimized for extreme vertical angle viewing, or isocontrast optimized for viewing at both large left and right angles above normal viewing. It is also possible to adjust the configuration and parameters to improve both the contrast and gray scale stability over a specified field of view, or to further optimize one at the expense of the other. Furthermore, a negatively birefringent A-plate may be substituted for a positively birefringent A plate. In this case, the negative birefringent A-plate would be oriented with its extraordinary axis perpendicular to the orientation appropriate for a positively birefringent A-plate. As would be understood by one skilled in the art of liquid crystal display design, additional changes would also be required in the other components of the compensator to optimize performance when a negative A-plate is used.

2.4 Summary

When viewed directly, a twisted nematic liquid crystal display provides high quality output, but at large viewing angles the image tends to degrade and exhibit poor contrast and gray scale nonuniformity. This occurs because the phase retardation effect of the liquid crystal material on light passing through it inherently varies with the inclination angle of the light, leading to a lower quality image at large viewing angles. By introducing one or more optical compensating elements in conjunction with the liquid crystal cell, however, it is possible to substantially correct for the undesirable angular effects and thereby maintain higher contrast and stable relative gray scale intensities at larger viewing angles than otherwise possible.

3. SUMMARY OF THE INVENTION

A monolithic O-plate optical compensator device, in accordance with the invention, comprises a plurality of thin-film compensation layers which are deposited on a single substrate. As used herein, the term "monolithic" is meant to imply that the O-plate and other thin-film compensator layers are formed by depositing (e.g., via solvent casting or vacuum deposition) one layer on top of another layer; with or without the use of surface modification treatments such as adhesion layers, alignment layers, and the like.

4. BRIEF DESCRIPTION OF DRAWINGS

5. DETAILED DESCRIPTION OF A SPECIFIC EMBODIMENT

One illustrative embodiment of the invention is described below as it might be implemented using thin film techniques to create a monolithic compensator device. In the interest of clarity, not all features of an actual implementation are described in this specification. It will of course be appreciated that in the development of any such actual implementation (as in any development project), numerous implementation-specific decisions must be made to achieve the developers' specific goals and subgoals, such as compliance with system- and business-related constraints, which will vary from one implementation to another. Moreover, it will be appreciated that such a development effort might be complex and time-consuming, but would nevertheless be a routine undertaking of device engineering for those of ordinary skill having the benefit of this disclosure.

5.1 Overview of Liquid Crystal Display Structure

Figure 1A:
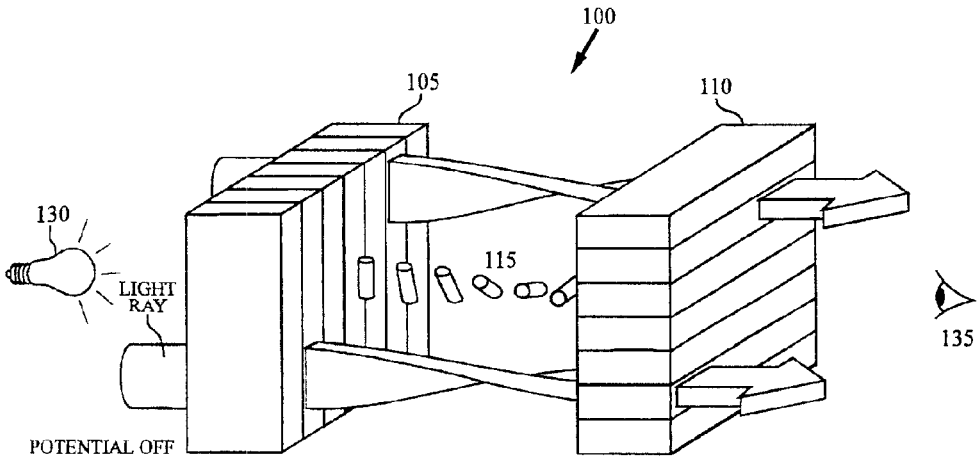
Figure 1A (Prior Art)
FIGS. 1A and 1B show, in overview, the operation of a normally white, 90° twisted nematic liquid crystal display.
Figure 1B:
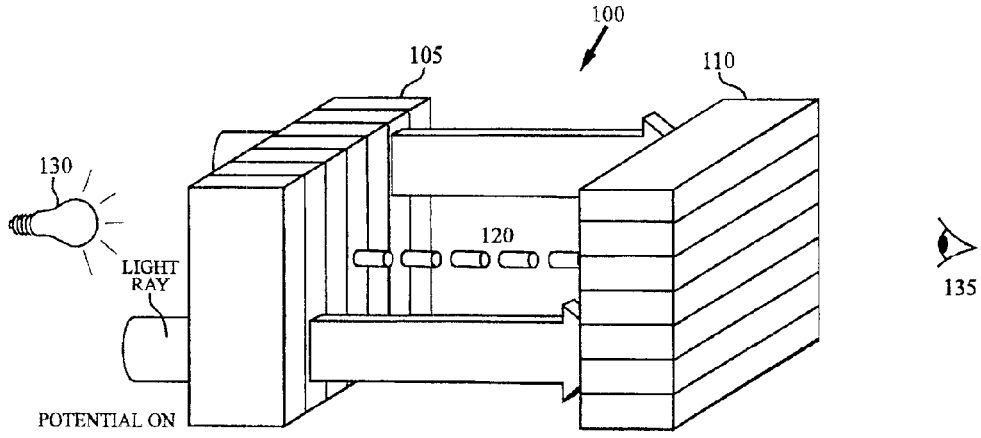
Figure 1B (Prior Art)
Figure 2:
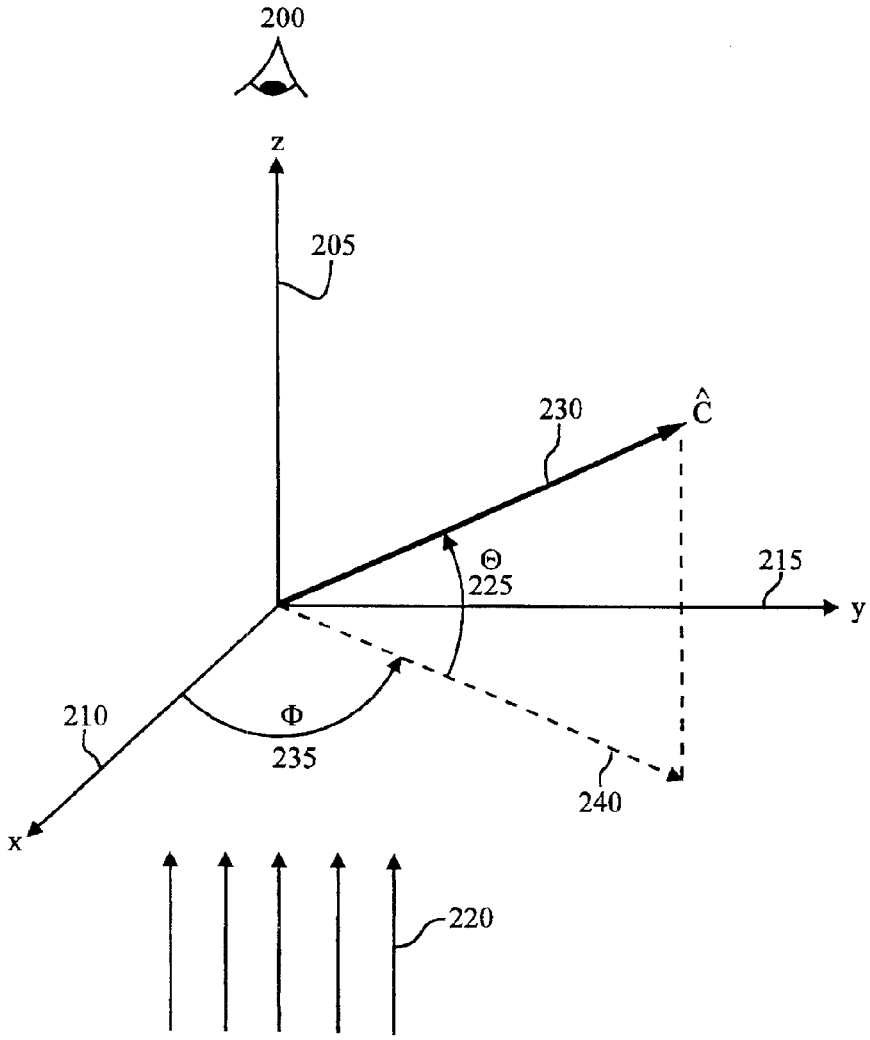
Figure 2 (Prior Art)
FIG. 2 depicts the coordinate system that is used to specify component orientations in the description of this invention.
Figure 3:
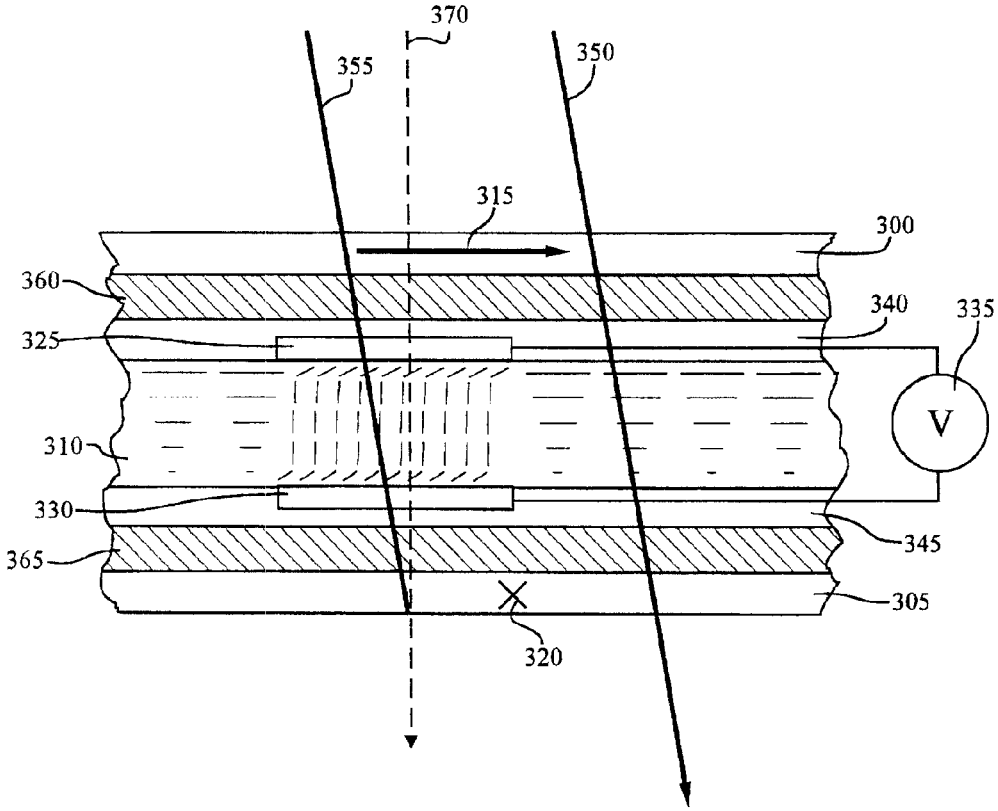
Figure 3 (Prior Art)
FIG. 3 is a cross sectional schematic view of a 90° twisted nematic, transmissive type normally white liquid crystal display.
Figure 4:
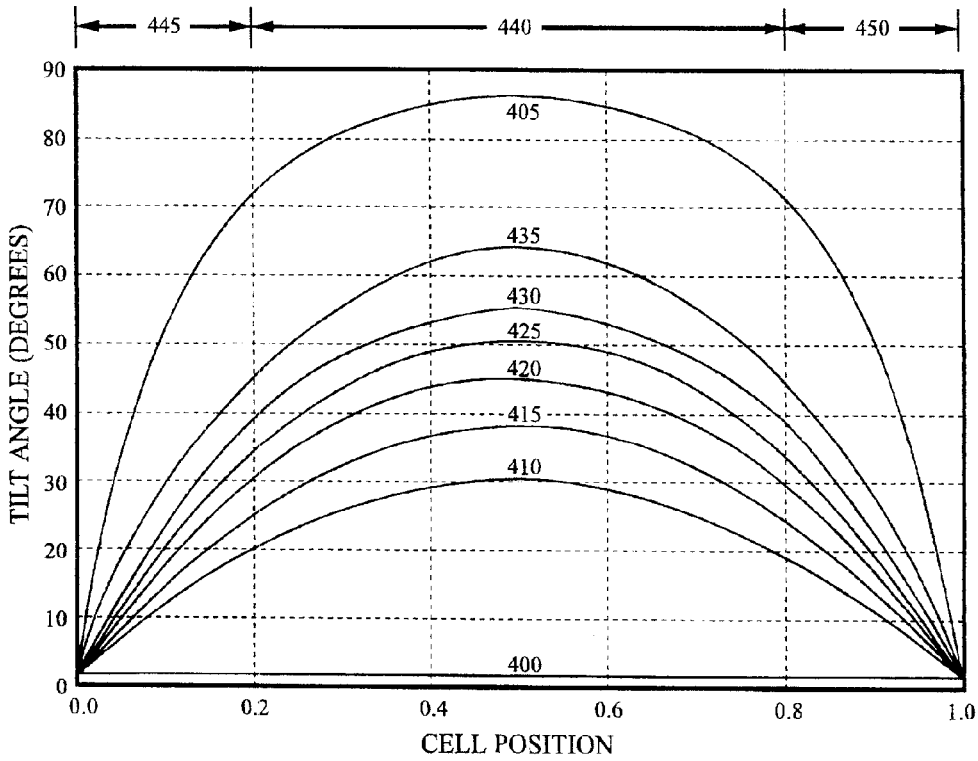
Figure 4 (Prior Art)
FIG. 4 is a plot of the tilt angle of the director (in degrees along the vertical axis) as a function of position (as a fraction of the depth along the horizontal axis) in a 90° twisted nematic liquid crystal cell.
Figure 5:
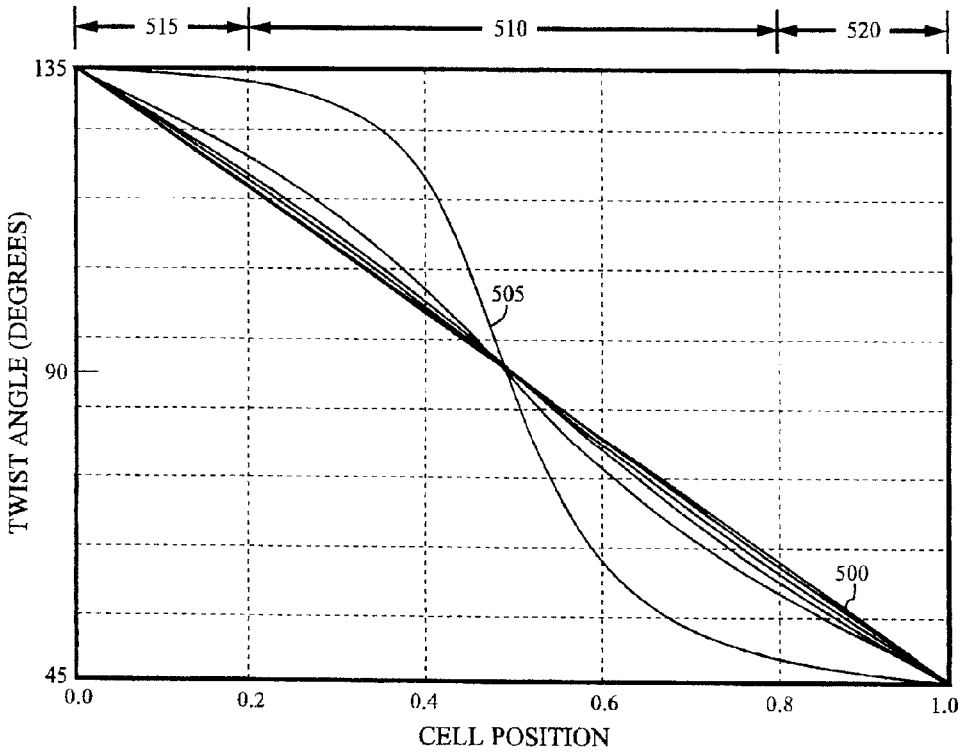
Figure 5 (Prior Art)
FIG. 5 is a related plot for the cell shown in FIG. 4, depicting the twist angle of the liquid crystal molecules as a function of their position in the cell.
Figure 6:
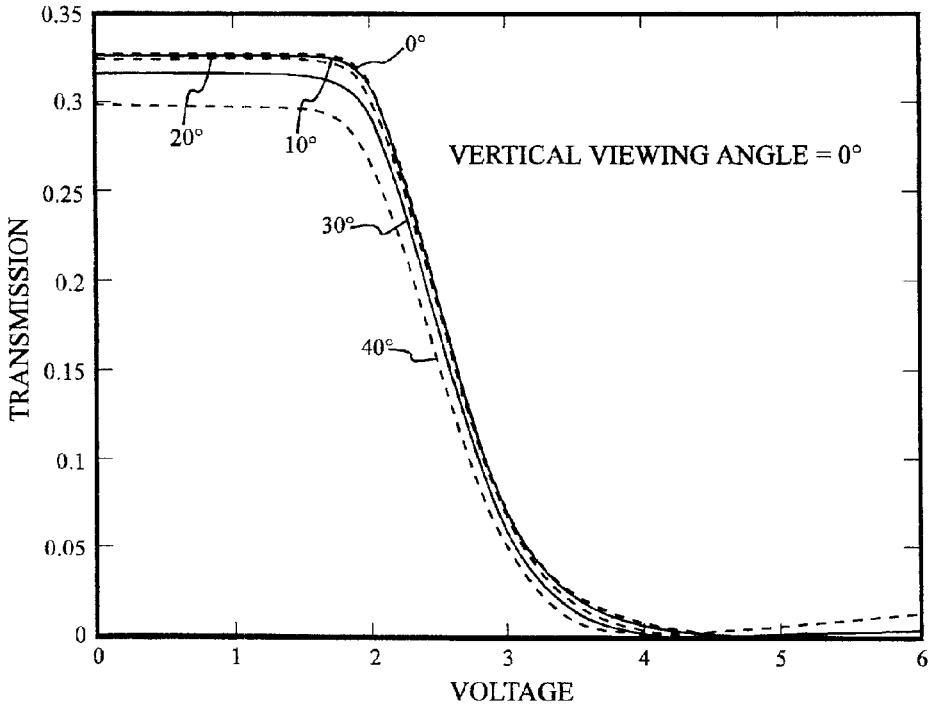
Figure 6 (Prior Art)
FIG. 6 is a plot of calculated brightness vs. voltage (BV) electro-optic curves at a variety of horizontal viewing directions for a typical twisted nematic display without the benefit of O-plate gray scale compensation.
Figure 7:
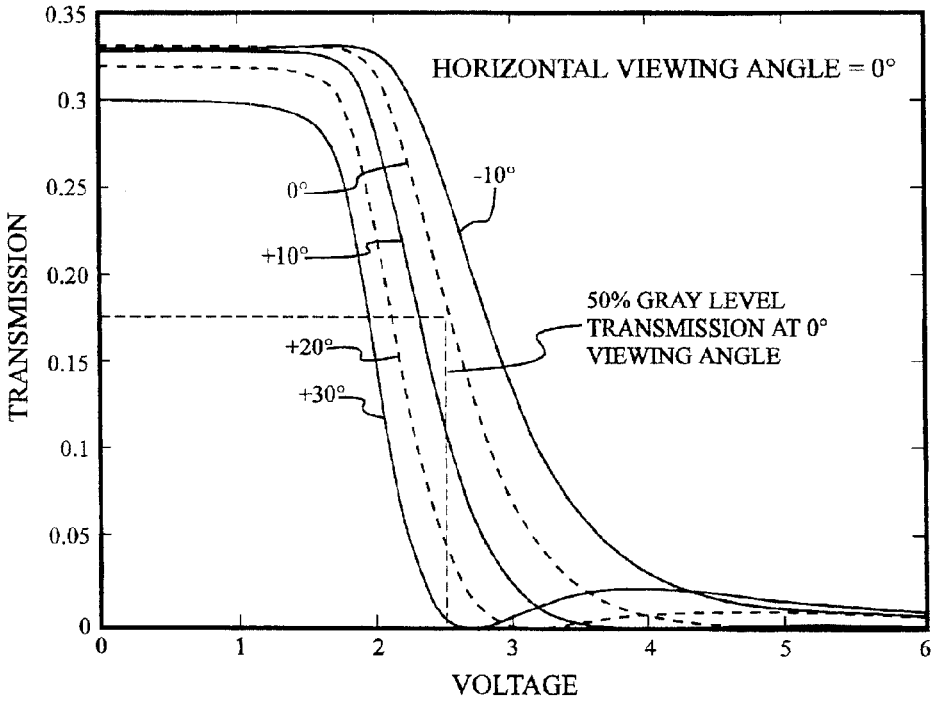
Figure 7 (Prior Art)
FIG. 7 is a plot of calculated brightness vs. voltage (BV) electro-optic curves at a variety of vertical viewing directions for a typical twisted nematic display without the benefit O-plate gray scale compensation.
Figure 8:
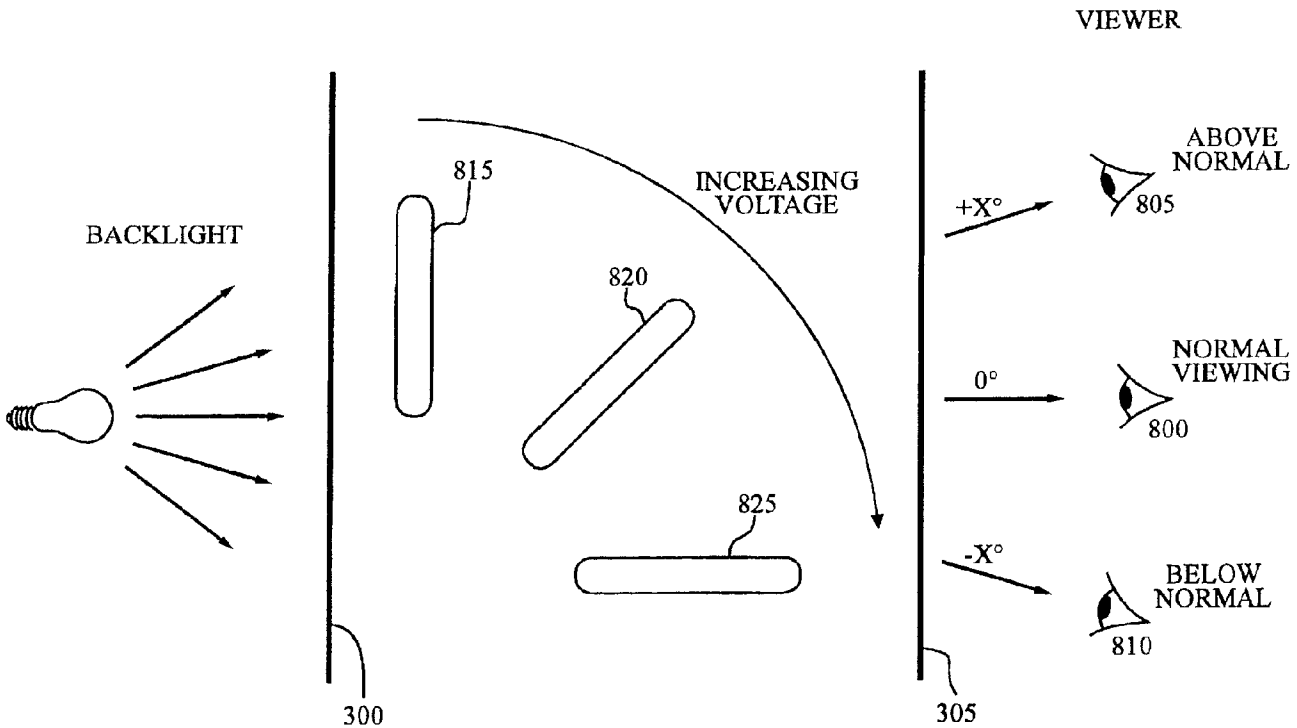
Figure 8 (Prior Art)
FIG. 8 is an illustration of the viewer's perspective relative to the average director orientation of a liquid crystal.
Figure 9:
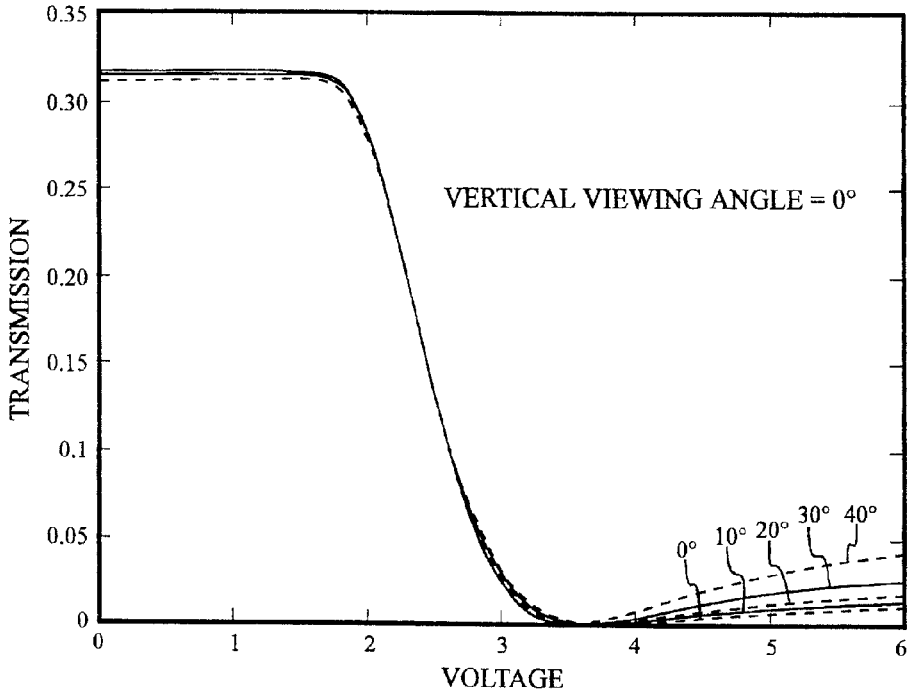
Figure 9 (Prior Art)
FIGS. 9 show calculated brightness vs. voltage electro-optic curves for a normally white, twisted nematic liquid crystal display, at a variety of horizontal viewing directions having the benefit of O-plate compensation in accordance with the invention.
Figure 10:
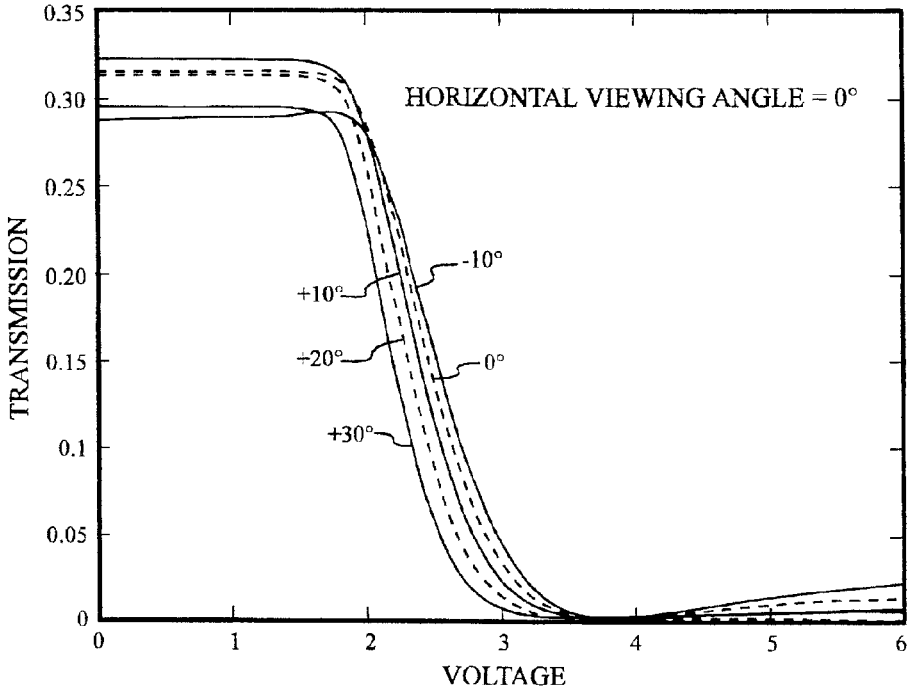
Figure 10 (Prior Art)
FIGS. 10 show calculated brightness versus voltage electro-optic curves for a normally white, twisted nematic liquid crystal display, at a variety of vertical viewing directions having the benefit of O-plate compensation in accordance with the invention.
Figure 11:
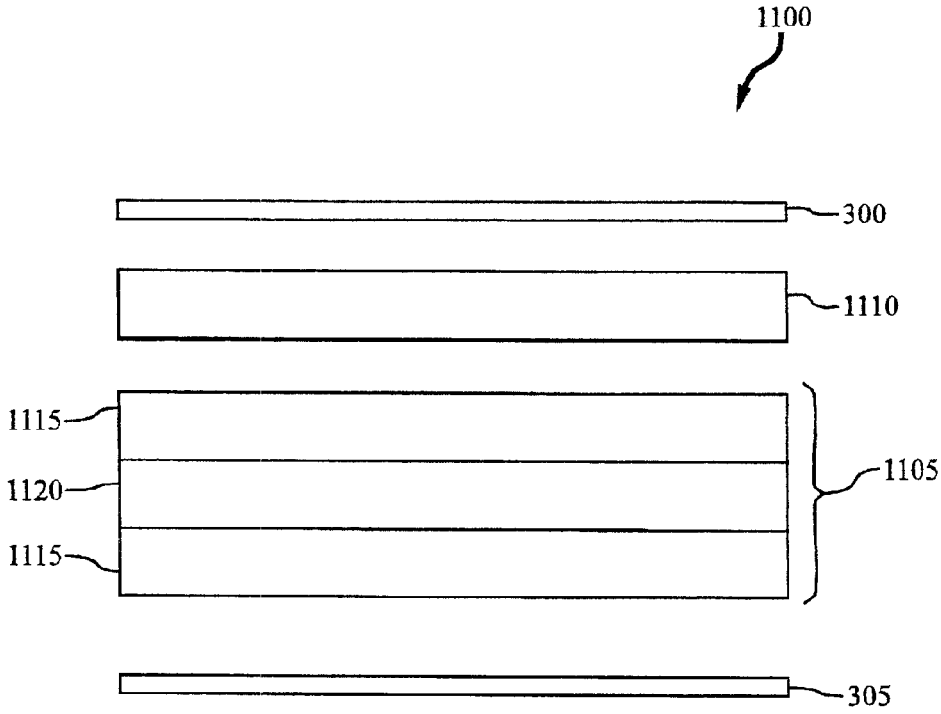
FIG. 11 is a cross-sectional view of an illustrative liquid crystal display in accordance with the invention.

FIG. 11 shows an illustrative liquid crystal display 1100 in accordance with the invention. The liquid crystal display 1100 includes a conventional polarizer 300, a conventional analyzer 305 that has a transmission axis perpendicular to the transmission axis of the polarizer 300, a conventional liquid crystal cell 1105, and a novel monolithic compensator 1100. As is well known to those of ordinary skill, the liquid crystal cell 1105 typically is defined by two substrate walls 1115, between which is a layer of liquid crystal material 1120. Of course, an actual display would also include electrodes to receive a video display signal and perhaps other elements such color filters (not shown).

5.2 Monolithic Compensator Structure

Disposed between the polarizer layer 300 and the analyzer layer 305 is a monolithic compensator 1110 in accordance with the invention. A typical monolithic compensator 1110 is shown in expanded view in FIG. 12. The monolithic compensator includes a substrate 1200, which may be of any convenient transparent material such as glass or plastic. The substrate 1200 may be a separate component specifically designed to function as a compensator substrate. Alternatively, the substrate 1200 may be one of the substrates used as a wall 1115 of the liquid crystal cell 1105, the polarizer layer 300, or the analyzer layer 305. It will be apparent to those of ordinary skill having the benefit of this disclosure that multiple instances of the substrate 1200 may be formed on any or all of these components.

The illustrative monolithic compensator 1110 includes a positively birefringent O-plate thin-film compensator layer 1210 with a suitable conventional surface treatment 1205 between that layer and the monolithic compensator 1110. The surface treatment 1205 provides for the desired orientation of the O-plate compensator layer and further can act as a layer to promote adhesion of the O-plate thin-film compensator layer to the substrate 1200.

The illustrative monolithic compensator 1110 also includes one or more additional thin-film compensator layers. The additional layer(s) may comprise, e.g., (i) another positively birefringent O-plate compensator layer similar to but having a different optical axis orientation than the O-plate compensator layer 1210; (ii) a positively birefringent A-plate compensator layer 1220, (iii) a negatively birefringent A-plate compensator layer, not shown, and (iv) a negatively birefringent C-plate compensator layer 1230. It will be appreciated by those of ordinary skill that the illustrative monolithic compensator 1110 may also include suitable conventional surface treatments between any two layers such as the surface treatments 1205, 1215, and 1225.

The arrangement of components in the monolithic compensator 1110 may take a wide variety of forms, and the different thin-film compensator layers need not be arranged in any particular order. See, for example, the various component arrangements summarized in Table 1 above. The invention is not limited to the particular arrangement shown as monolithic compensator 1110 in FIG. 12.

5.3 Manufacture of the Monolithic Compensator

A manufacturing process for fabricating a monolithic compensator is discussed with reference to the illustrative monolithic compensator 1110. It will be understood that similar processes may be used for the various thin-film layers in whatever order they are arranged on the substrate 1200.

The O-plate thin-film compensator layer 1210 may be deposited on the substrate 1200 (or on any other thin-film layers previously deposited, as discussed above) by any convenient method, e.g., a solvent-casting process. Two examples of deposition processes for O-plate thin-film compensator layers are taught in the previously cited co-pending U.S. patent applications. It should be noted that the term "deposition" here is intended to be distinct from lamination, in which pre-formed compensator layers are glued or otherwise bonded to the substrate 1200.

The positively birefringent A-plate thin-film compensator layer 1220 may be deposited via any convenient process, e.g., a solvent casting process. In an illustrative embodiment, an alignment layer 1215 is produced by coating a surface of an O-plate compensator layer 1210 (acting as a substrate to a subsequent A-plate layer 1220) with a polyimide material that produces a nearly zero liquid crystal pretilt angle. A thin film of the liquid crystal monomer is formed on the alignment layer 1215 by the use of spin coating from a solution of the liquid crystal material in a solvent. Other methods of producing thin films of organic liquid crystal material include dip and slot-die coating. The concentration of the liquid crystal monomer, a diacrylate material that has an intrinsic nematic/air tilt angle of nearly zero degrees, is about 10%. The solvent is monochlorobenzene. The coating solution also includes approximately 0.05% Irgacure-651, a photoinitiator. As would be obvious to those skilled in the art, many other different materials could be used for the liquid crystal monomer, Irgacure-651 and monochlorobenzene.

After the liquid crystal film is produced, the solvent is evaporated off and the temperature of the liquid crystal layer is adjusted to produce a thin film of the liquid crystal material in the nematic phase. Next, the liquid crystal film is illuminated with ultraviolet light (actinic radiation) at a wavelength of approximately 360 nanometers (nm) to achieve a total exposure that is sufficient to polymerize the monomer to a polymeric film in which the order of the liquid crystal phase is preserved, typically 4-10 J/cm$^2$. The result of this process is a thin film of liquid crystal polymer that is positively birefringent and has a symmetry axis that is oriented substantially in the plane of the film, hence, an A-plate 1220.

The C-plate thin-film compensator layer of 1230 may be deposited via any convenient process, e.g., a solvent casting process. One example of a deposition process for C-plate thin-film compensator layers is taught in allowed application Ser. No. 08/072,137, filed Jun. 4, 1993, assigned to the University of Akron and exclusively licensed to the assignee of this application. Another process for negatively birefringent C-plate thin-film compensator layer deposition is described in Yeh et al., assigned to the assignee of this application.

In many circumstances some of the thin-film layers may not require surface treatments. For example, a polyimide thin-film negative C-plate compensator layer does not require the use of an alignment layer, and further may be used itself as an alignment layer for subsequent A-plate or O-plate thin-film layers when the A-plate or O-plate layers are formed by solvent casting of liquid crystal material. (It will be apparent to those of ordinary skill that in such a case the polyimide thin-film C-plate compensator layer would require a conventional rubbing operation.)

5.4 Advantages of the Monolithic Compensator

Figure 12:
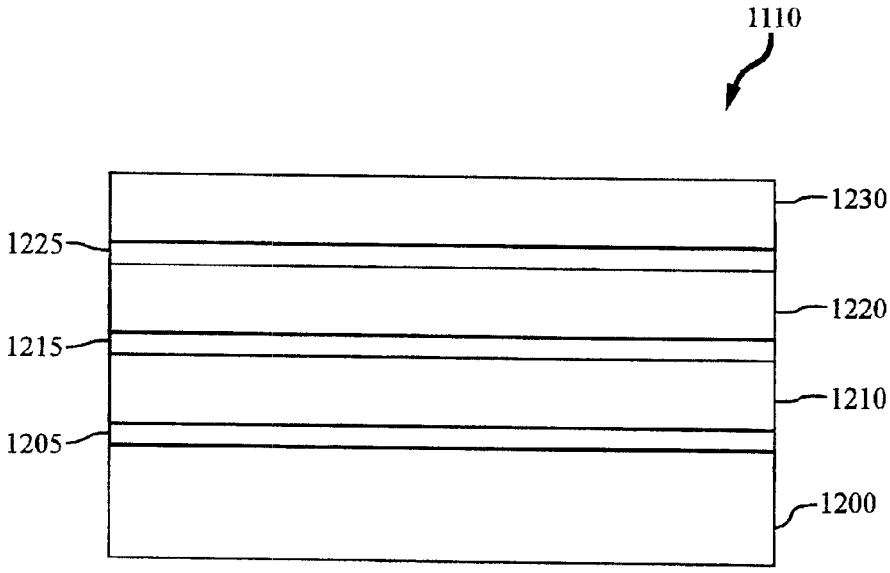
FIG. 12 shows an expanded cross-sectional view of a monolithic compensator device in accordance with the invention.

The benefits of the monolithic compensator illustrated in FIG. 12 include, for example, reduction in parts count (and thus in parts cost); reduced assembly costs; and reduced weight/thickness of a display using a monolithic compensator in accordance with the invention. The reduced display weight can be especially important in, e.g., avionics and personal-computer applications, in which savings of a few ounces can be significant.

The monolithic compensator also contributes to improved reliability and yield of the liquid crystal display assembly process. In addition, as noted above, the compensator thin-film layers can be laid down directly on the liquid crystal glass, i.e., on the wall of the liquid crystal cell 1105. Significant weight and cost reductions are thus achieved by eliminating a separate compensator substrate.

Using deposition techniques to lay down a plurality of thin-film compensator layers also reduces the number of adhesive layers needed to keep the various compensator elements together in the display. This, in turn, can increase display reliability by reducing the problems associated with adhesive failure.

By reducing the number of glass substrates used in a liquid crystal display, the potentially annoying reflectivity of the display is concomitantly reduced. A similar benefit accrues from the elimination of adhesive layers discussed above.

6. BIBLIOGRAPHY

1. Clerc et al., "Liquid Crystal Cell Which Can Have A Homeotropic Structure With Compensated Birefringence Of Said Structure," U.S. Pat. No. 4,701,028

2. Kahn, "The Molecular Physics of Liquid-Crystal Devices," Physics Today, pp. 68-74, May 1982.

3. Macleod, "Structure-Related Optical Properties of Thin Films," J. Vac. Sci. Technol. A, Vol. 4, No. 3, pp. 418-422, 1986.

4. Motohiro and Taga, "Thin Film Retardation Plate by Oblique Deposition," Appl. Opt., Vol. 28, No. 3, pp. 2466-2482, 1989.

5. Yeh, et al., "Compensator for Liquid Crystal Display". U.S. Pat. No. 5,196,953.

It will be appreciated by those of ordinary skill having the benefit of this disclosure that numerous variations from the foregoing illustration will be possible without departing from the inventive concept described herein. Accordingly, it is the claims set forth below, and not merely the foregoing illustrative embodiments, which are intended to define the exclusive rights claimed in this application program.

What is claimed is:

1. A monolithic compensator for a liquid crystal display comprising:

(a) a first deposited thin-film *positively birefringent O-plate* compensator layer having a first surface;

(b) a second thin-film compensator layer deposited onto said first surface of said first compensator layer, wherein [each of said first and] said second deposited thin-film compensator [layers are] *layer is* selected from the group consisting of (i) a positively birefringent O-plate compensator layer, (ii) a positively birefringent A-plate compensator layer, (iii) a negatively birefringent A-plate compensator layer and (iv) a negatively birefringent C-plate compensator layer.

2. The monolithic compensator of claim 1, wherein one or more thin-film layers of material are deposited between said first deposited thin-film compensator layer and said second deposited thin-film compensator layer.

3. The monolithic compensator of claim 2, wherein at least one of said one or more thin-film layers is a deposited thin-film compensator layer.

4. A liquid crystal display comprising:

(a) a polarizer layer;

(b) an analyzer layer;

(c) a liquid crystal cell having a first transparent substrate and a second transparent substrate forming respective walls of said liquid crystal cell, said liquid crystal cell disposed between said polarizer layer and said analyzer layer; and (d) a monolithic compensator in accordance with a specified one of claims 1, 2, or 3 disposed between said polarizer layer and said analyzer layer.

5. A compensator element for a liquid crystal display comprising:

(a) an optically transparent substrate; and (b) a monolithic compensator in accordance with a specified one of claims 1, 2, and 3, operatively coupled to a optically transparent substrate.

6. The compensator element of claim 5, wherein said optically transparent substrate is an optical polarizer.

7. The compensator element of claim 5, wherein said optically transparent substrate is one surface of a liquid crystal cell.

* * * * *